United States Patent
Oppelt

(10) Patent No.: US 8,513,998 B2
(45) Date of Patent: Aug. 20, 2013

(54) PROVISION OF AN AC SIGNAL

(75) Inventor: Ralph Oppelt, Uttenreuth (DE)

(73) Assignee: Siemens Aktiengesellschaft, München (DE)

( * ) Notice: Subject to any disclaimer, the term of this patent is extended or adjusted under 35 U.S.C. 154(b) by 0 days.

(21) Appl. No.: 13/230,627

(22) Filed: Sep. 12, 2011

(65) Prior Publication Data
US 2012/0235723 A1 Sep. 20, 2012

(30) Foreign Application Priority Data
Sep. 14, 2010 (DE) .......................... 10 2010 040 723

(51) Int. Cl.
*H03K 12/00* (2006.01)
(52) U.S. Cl.
USPC .......................................................... 327/184
(58) Field of Classification Search
USPC .......................................................... 327/184
See application file for complete search history.

(56) References Cited

U.S. PATENT DOCUMENTS

| | | | |
|---|---|---|---|
| 3,205,294 A * | 9/1965 | Maynard .......................... 84/699 |
| 3,327,139 A * | 6/1967 | Hillman .......................... 327/331 |
| 3,328,686 A * | 6/1967 | Fuchs .......................... 324/76.21 |
| 3,466,552 A * | 9/1969 | Sels .......................... 327/69 |
| 3,562,744 A * | 2/1971 | Howlett .......................... 41/139 |
| 3,564,441 A * | 2/1971 | Eide .......................... 30/302 |
| 3,593,156 A * | 7/1971 | Jordan .......................... 327/116 |
| 3,622,800 A * | 11/1971 | Abela .......................... 327/100 |
| 4,075,577 A * | 2/1978 | Walker .......................... 331/17 |
| 4,084,136 A * | 4/1978 | Libby et al. .......................... 324/238 |
| 4,634,983 A * | 1/1987 | Schemmel et al. .......................... 327/184 |
| 4,686,385 A * | 8/1987 | Sharpe .......................... 327/184 |
| 5,309,345 A * | 5/1994 | Nakamura et al. .......................... 363/41 |
| 5,315,260 A | 5/1994 | Link et al. |
| 5,508,663 A * | 4/1996 | Konno .......................... 330/10 |
| 7,152,727 B2 * | 12/2006 | Waechter .......................... 194/317 |
| 7,402,425 B2 * | 7/2008 | Weinberg et al. .......................... 435/287.2 |
| 7,710,176 B2 * | 5/2010 | Yang .......................... 327/178 |
| 2003/0072462 A1* | 4/2003 | Hlibowicki .......................... 381/96 |

FOREIGN PATENT DOCUMENTS

| | | |
|---|---|---|
| DE | 3417624 A1 | 11/1985 |
| DE | 38 24 557 A1 | 1/1990 |

OTHER PUBLICATIONS

German Office Action dated Jun. 9, 2011 for corresponding German Patent Application No. DE 10 2010 040 723.2 with English translation.
German Office Action dated Mar. 21, 2013 for corresponding German Patent Application No. DE 10 2010 040 723.2 with English translation.

* cited by examiner

*Primary Examiner* — William Hernandez
(74) *Attorney, Agent, or Firm* — Lempia Summerfield Katz LLC

(57) ABSTRACT

A circuit for providing an AC signal includes an amplifier having an input and an output. A sinusoidal signal is applicable at the input of the amplifier. The output of the amplifier is connected to the input via a lowpass filter or via a part of the lowpass filter.

23 Claims, 1 Drawing Sheet

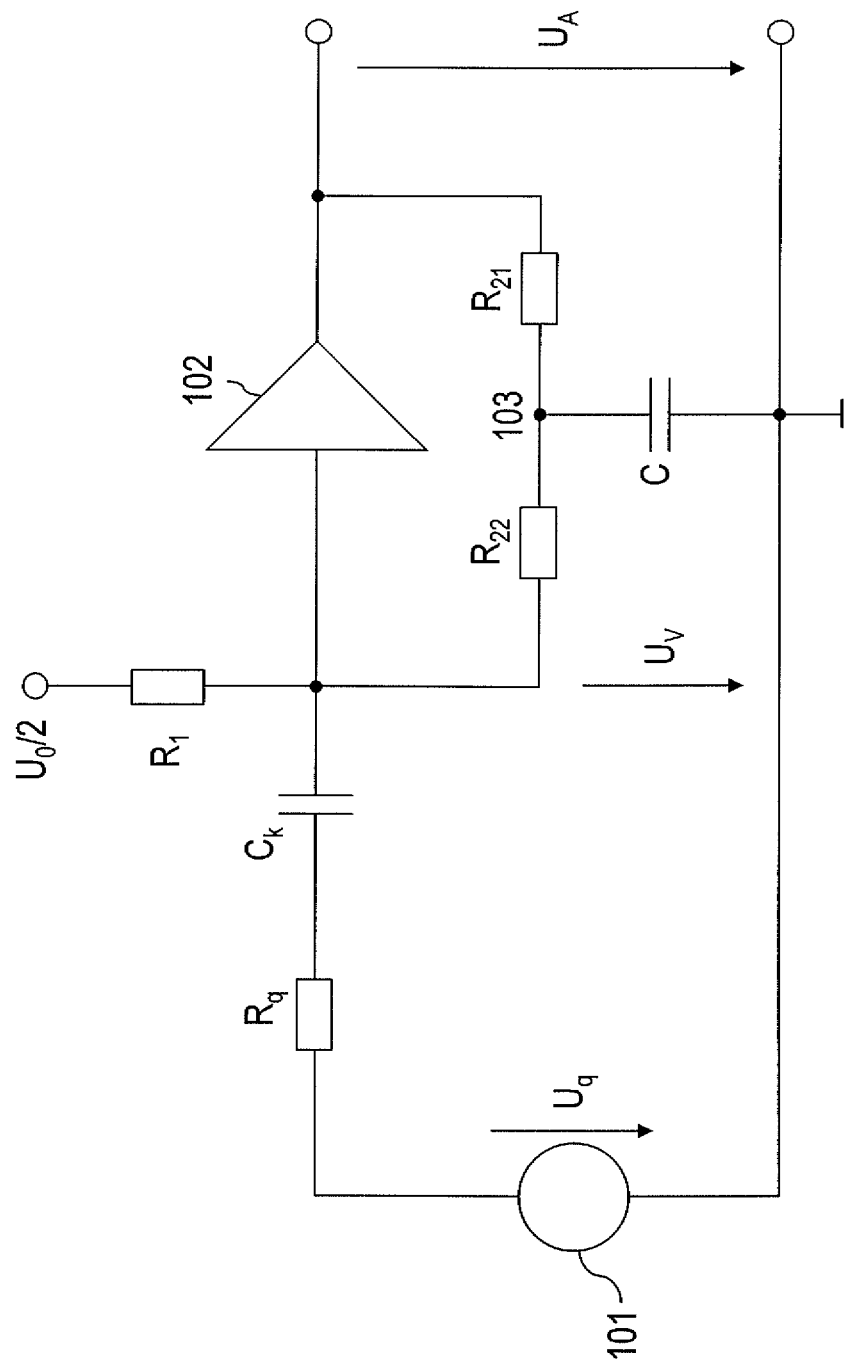

PROVISION OF AN AC SIGNAL

This application claims the benefit of DE 10 2010 040 723.2, filed on Sep. 14, 2010.

BACKGROUND

The present embodiments relate to a circuit for providing an AC signal and a method for operating the circuit.

A square-wave signal may be used as a clock signal or an oscillator signal for different electronic applications. With this in view, effort is frequently directed at realizing a maximally symmetric pulse-pause ratio. A given signal is initially sinusoidal with a low amplitude. The signal is amplified using a logic gate and converted into a square-wave signal. For example, an input of the logic gate may be forward-biased via a resistor for this purpose to approximately half of an operating voltage.

The problem that exists is that if the sinusoidal signal is switched off at the input of the logic gate or if the amplitude of the sinusoidal signal is too low, an output of the logic gate has no stable state (either logic "0" or logic "1", also referred to as "low" or "high" potential). Instead, the output of the logic gate may oscillate in an undefined manner between the two logic states. For example, the logic gate will oscillate unpredictably in the MHz or GHz range.

SUMMARY AND DESCRIPTION

The present embodiments may obviate one or more of the drawbacks or limitations in the related art. For example, a circuit that prevents a logic gate from assuming unpredictable states or from switching (e.g., oscillating) in an undesirable manner at a varying or very high frequency between the logic states, may be provided.

In one embodiment, a circuit for providing an AC signal (e.g., a clock signal) is provided. The circuit includes an amplifier having an input and an output. A sinusoidal signal may be applied at the input of the amplifier. The output of the amplifier is connected to the input of the amplifier via a lowpass filter or via a part of the lowpass filter.

The lowpass filter may be a lowpass filter circuit having, for example, a plurality of components, some or all of the plurality of components being provided in a feedback branch (e.g., a return feed) between the output and the input of the amplifier.

Using the feedback via the lowpass filter or the part of the lowpass filter, the input of the amplifier may be locked automatically if the input voltage is too low, thereby providing that no undefined operation or undesirable oscillation of the amplifier will occur.

The sinusoidal signal is an AC signal having a substantially sinusoidal character. The sinusoidal signal may also be a signal that is similar to an AC signal having a sinusoidal character (e.g., a triangular signal or a trapezoidal signal).

In one embodiment, the AC signal may be provided using the amplifier as a function of the sinusoidal signal, the AC signal being, for example, a square-wave signal having a greater amplitude than the sinusoidal signal.

For example, the sinusoidal signal as input signal specifies a particular frequency, the AC signal (e.g., a square-wave signal) of the amplifier being generated or provided as a function of the particular frequency. In one embodiment, the amplifier has a large gain in a region of a switchover threshold.

In one embodiment, the input of the amplifier may be forward-biased to half of the operating voltage or to approximately half of the operating voltage.

For this purpose, the input of the amplifier, for example, is connected via a resistor to half of the operating voltage. Half of the operating voltage may also be provided using a voltage divider.

In one embodiment, the amplifier is, for example, a noninverting amplifier.

For example, the amplifier may be implemented as an amplifier that is operated with positive feedback.

In another embodiment, the amplifier is a DC-coupled amplifier.

In yet another embodiment, the amplifier is a logic gate. Accordingly, the amplifying function of a logic gate or a buffer may be used.

In one embodiment, the lowpass filter is a passive lowpass filter or an active lowpass filter. For example, a passive lowpass filter may be realized as an RC element (e.g., as a combination of resistors and capacitors), and an active lowpass filter may be realized using an operational amplifier or some other actively controllable component.

In one embodiment, the cutoff frequency of the lowpass filter is less than the frequency of the sinusoidal signal.

The cutoff frequency of the lowpass filter may be substantially less than the frequency of the sinusoidal signal.

In one embodiment, the lowpass filter has at least one resistor in a feedback branch between the input and the output of the amplifier.

In another embodiment, the capacitance provided for the lowpass filter effect is provided by a coupling capacitor, the coupling capacitor being disposed between a source of the sinusoidal signal and the input of the amplifier.

Thus, a single resistor may be disposed in the feedback branch in conjunction with the coupling capacitor provided between the source of the sinusoidal signal and the input of the amplifier. The resistor in the feedback branch and the coupling capacitor accordingly act as a lowpass filter.

With the aid of the coupling capacitor, the source is DC-decoupled from the resting potential prevailing at the input of the amplifier.

According to one embodiment, two resistors connected in series are provided in the feedback branch. The junction point between the series-connected resistors is connected to ground via a capacitor.

In one embodiment, the circuit may be used for clock generation. The circuit may also be integrated in a chip.

A method for providing an AC signal such as, for example, a clock signal (e.g., on a chip) with the aid of the circuit described is also provided.

BRIEF DESCRIPTION OF THE DRAWINGS

FIG. 1 shows a schematic circuit diagram of one embodiment of a circuit that prevents an amplifier or a logic gate from assuming unpredictable states or from oscillating out of control in an undesirable manner at a varying or very high frequency.

DETAILED DESCRIPTION OF THE DRAWINGS

A logic gate that is used for amplifying and for limiting sinusoidal signals may be forward-biased, for example, at an input of the logic gate to half of a supply voltage or to approximately half of the supply voltage. This results in maximum sensitivity and produces a maximally symmetric pulse-pause ratio at an output of the logic gate. The logic gate converts a low-amplitude sinusoidal signal into a square-wave signal of higher amplitude. The square-wave signal may be used, for example, as a clock or an oscillator signal.

It is disadvantageous that if the level of the sinusoidal signal at the input of the logic gate is in too low a range, an unstable state is reached, with the result that the output of the logic gate oscillates back and forth unpredictably between logic levels "0" and "1".

The approach presented here prevents or significantly inhibits such an undesirable unstable state at the output of the logic gate.

This may be achieved in that an output signal of the logic gate is fed back via a lowpass filter to the input of the logic gate.

FIG. 1 shows a schematic circuit diagram illustrating the mode of operation of one embodiment of a circuit that prevents an amplifier or a logic gate from assuming unpredictable states.

A source 101 provides a sinusoidal signal having voltage $U_q$. The source 101 is connected to ground on one side and to an input of a logic gate 102 via an internal resistor $R_q$ (e.g., an internal resistor) and a capacitor $C_k$ (e.g., a coupling capacitor) on the other side. Half of a supply voltage $U_0/2$ is connected to the input of the logic gate 102 via a resistor $R_1$. The input of the logic gate 102 is connected to a node 103 via a resistor $R_{22}$ (e.g., a feedback resistor). The node 103 is connected to ground via a capacitor C. The node 103 is also connected to the output of the logic gate 102 via a resistor $R_{21}$ (e.g., a feedback resistor).

A voltage $U_v$ is present at the input of the logic gate 102 and a voltage $U_A$ is applied at the output of the logic gate 102.

It is assumed, by way of example, that the switchover threshold of the logic gate 102 is at half of the supply voltage $U_0/2$ and that the logic gate 102 has a large gain in a region of a switchover threshold.

A cutoff frequency of the lowpass filter, the lowpass filter including the resistor $R_{21}$ and the capacitor C, may be far lower than an input frequency $f_{in}$ of the source 101, $$\frac{1}{2\pi R_{21} C} \ll f_{in}. \tag{1}$$

According to the superposition theorem, a DC bias voltage is produced at the input of the "resting" logic gate, as follows $$U_V = \frac{0.5 \cdot U_0 R_2 + U_A R_1}{R_1 + R_2}, \tag{2}$$

where $$R_2 = R_{21} + R_{22}$$

is the sum of the two feedback resistors, and $U_A$ is the constant voltage at the output of the logic gate in the quiescent state. For the two logic states ("0" or "low" and "1" or "high") $U_{A\_low}=0$ and $U_{A\_high}=U_0$, it follows that:

$$U_{Vlow} = U_0 \frac{R_2}{2(R_1 + R_2)} \le \frac{U_0}{2} \tag{3}$$

and $$U_{Vhigh} = U_0 \frac{0.5 \cdot R_2 + R_1}{R_1 + R_2} = U_0 \left[1 - \frac{R_2}{2(R_1 + R_2)}\right] \ge \frac{U_0}{2}. \tag{4}$$

In order to provide that the gate output transitions from the two stable states to a square-wave oscillation when the source 101 is connected, the amplitude superimposed at the input just exceeds or falls below the switchover threshold $U_0/2$ at least once. Thus, the amplitude superimposed at the input reaches at least a value of $$U_{q,min} = U_{Vhigh} - \frac{U_0}{2} = \frac{U_0}{2} - U_{Vlow} = \frac{U_0}{2} \cdot \frac{R_1}{R_1 + R_2}. \tag{5}$$

The coupling capacitor constitutes an ideal through-connection for the source voltage $U_q$, and the internal resistor $R_q$ of the source 101 is very small in comparison with the resistor $R_1$ or the resistor $R_{22}$. With the condition $R_q \ll R_{22}$, the capacitor C does not, for example, overload the AC signal at the input of the logic gate 102 via the resistor $R_{22}$.

If the resistor $R_2$ is not present (e.g., the value of the resistor $R_2$ goes toward infinite), the input amplitude at the logic gate 102 may theoretically become arbitrarily small (which is precisely what is to be prevented), whereas the input amplitude is greater and greater as the resistor $R_2$ becomes smaller. For the special case $R_1=R_2$, the input amplitude at the logic gate 102 exceeds at least the value $U_0/4$.

If the output of the logic gate 102 flips periodically and consequently outputs a square-wave AC signal, the mean value of the output voltage $U_A$ moves from originally the operating voltage $U_0$ ("high") or from 0V ("low") in the direction of half of the operating voltage $U_0/2$, with the result that the bias voltage $U_v$ at the input of the logic gate 102 also moves increasingly via the feedback in the direction of half of the operating voltage $U_0/2$. As the input amplitude (e.g., the amplitude of the sinusoidal signal) increases, a symmetric pulse-pause ratio (e.g., a duty cycle of 50% "low" and "high" level in each case) is therefore quickly established.

If the conditions $$R_q \ll R_1$$

and $$R_q \ll R_2$$

may be fulfilled, the resistors $R_{21}$ and $R_{22}$ may be combined into a single resistor $R_2$. The capacitor C may be omitted. The resistor $R_2$ acts in conjunction with the coupling capacitor $C_k$ as a lowpass filter that shorts the fed-back AC voltage component via the low-impedance resistor $R_1$ of the source 101, while the fed-back DC voltage component acts, as described above, on the input of the logic gate 102.

Since the mean value of a symmetric gate output voltage is at half of the operating voltage, while the gate output in the quiescent state is at 0V ("low") or at the full operating voltage ("high"), a voltage feedback is proposed such that the gate input is locked automatically if the input voltage is too low. As a result, undefined (e.g., disruptive) operation is no longer possible.

The gate described is, for example, a logic gate. Alternatively, a noninverting DC-coupled amplifier may be used. The lowpass filter may also be embodied as an active lowpass filter.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A circuit for providing an alternating current (AC) signal, the circuit comprising:
   an amplifier including an input and an output,
   wherein the input of the amplifier is connected to receive a sinusoidal signal and receive a forward-biased direct current (DC) voltage through a first resistor, and
   wherein the output of the amplifier is connected to the input of the amplifier via a second resistor of a lowpass filter or a part of the lowpass filter.

2. The circuit as claimed in claim 1, wherein the amplifier provides the AC signal as a function of the sinusoidal signal and the DC voltage.

3. The circuit as claimed in claim 1, wherein the forward-biased DC voltage is half of an operating voltage or approximately half of the operating voltage.

4. The circuit as claimed in claim 1, wherein the amplifier is a noninverting amplifier.

5. The circuit as claimed in claim 1, wherein the amplifier is a DC-coupled amplifier.

6. The circuit as claimed in claim 1, wherein the amplifier comprises a logic gate.

7. The circuit as claimed in claim 1, wherein the lowpass filter is a passive lowpass filter or an active lowpass filter.

8. The circuit as claimed in claim 1, wherein a cutoff frequency of the lowpass filter is less than a frequency of the sinusoidal signal.

9. The circuit as claimed in claim 1, wherein the second resistor is in a feedback branch of the lowpass filter between the input and the output of the amplifier.

10. The circuit as claimed in claim 9, wherein a capacitance required for the lowpass filter effect is provided by a coupling capacitor, the coupling capacitor being disposed between a source of the sinusoidal signal and the input of the amplifier.

11. The circuit as claimed in claim 9, wherein the lowpass filter comprises two resistors connected in series, the two resistors being provided in the feedback branch, and
    wherein a center tap between the two series-connected resistors is connected to ground via a capacitor.

12. The circuit as claimed in claim 1, wherein the circuit is usable for clock generation.

13. The circuit as claimed in claim 1, wherein the circuit is integrated in a chip.

14. The circuit as claimed in claim 2, wherein the AC signal is a square-wave signal having a greater amplitude than the sinusoidal signal.

15. The circuit as claimed in claim 2, wherein the input of the amplifier is operable to be forward-biased to half of an operating voltage or to approximately half of the operating voltage.

16. The circuit as claimed in claim 2, wherein the amplifier is a noninverting amplifier.

17. The circuit as claimed in claim 3, wherein the amplifier is a DC-coupled amplifier.

18. The circuit as claimed in claim 7, wherein the lowpass filter comprises at least one resistor in a feedback branch between the input and the output of the amplifier, the at least one resistor comprising the second resistor.

19. The circuit as claimed in claim 1, wherein the lowpass filter comprises at least one resistor in a feedback branch between the input and the output of the amplifier, the at least one resistor comprising the second resistor.

20. A method for providing an AC signal using a circuit comprising an amplifier that includes an input and an output, the method comprising:
    applying a sinusoidal signal at the input of the amplifier;
    applying a forward-biased direct current (DC) voltage to the input of the amplifier through a first resistor; and
    connecting the output of the amplifier to the input of the amplifier via a second resistor of a lowpass filter or a part of the lowpass filter.

21. A circuit for providing an alternating current (AC) signal, the circuit comprising:
    a logic gate having an operating voltage and a switchover threshold set substantially equal to half of the operating voltage;
    an input of the logic gate connected to receive a sinusoidal signal and a forward-biased direct current (DC) voltage set substantially equal to half of the operating voltage of the logic gate;
    an output of the logic gate, and
    a lowpass filter, wherein the output of the logic gate is connected to the input of the logic gate via the lowpass filter.

22. The circuit of claim 21, wherein the lowpass filter is configured to short the input of the logic gate when the sinusoidal signal is below a low level.

23. The circuit of claim 22, wherein the input of the logic gate is automatically locked if the sinusoidal signal is below the low level.

* * * * *